(12) United States Patent
Spinelli et al.

(10) Patent No.: US 7,463,657 B2
(45) Date of Patent: Dec. 9, 2008

(54) INTRACAVITY FREQUENCY-TRIPLED CW LASER

(75) Inventors: Luis A. Spinelli, Sunnyvale, CA (US); Andrea Caprara, Mountain View, CA (US)

(73) Assignee: Coherent, Inc., Santa Clara, CA (US)

( * ) Notice: Subject to any disclaimer, the term of this patent is extended or adjusted under 35 U.S.C. 154(b) by 546 days.

(21) Appl. No.: 10/831,991

(22) Filed: Apr. 26, 2004

(65) Prior Publication Data

US 2005/0078718 A1    Apr. 14, 2005

Related U.S. Application Data

(60) Provisional application No. 60/509,990, filed on Oct. 9, 2003.

(51) Int. Cl.
*H01S 3/10* (2006.01)

(52) U.S. Cl. ............................................. 372/21; 372/22

(58) Field of Classification Search ............... 372/21–22
See application file for complete search history.

(56) References Cited

U.S. PATENT DOCUMENTS

| | | | | |
|---|---|---|---|---|
| 4,914,658 | A | * 4/1990 | Stankov et al. | 372/18 |
| 4,935,931 | A | * 6/1990 | McGraw | 372/18 |
| 5,278,852 | A | 1/1994 | Wu et al. | 372/22 |
| 5,296,960 | A | 3/1994 | Ellingson et al. | 359/330 |
| 5,390,211 | A | 2/1995 | Clark et al. | 372/95 |
| 5,511,085 | A | * 4/1996 | Marshall | 372/22 |
| 5,610,759 | A | 3/1997 | Delacourt et al. | 359/328 |
| 6,021,140 | A | * 2/2000 | Clark et al. | 372/18 |

(Continued)

FOREIGN PATENT DOCUMENTS

WO    WO 91/05386    4/1991

(Continued)

OTHER PUBLICATIONS

E. Roissé et al, "Intracavity frequency-tripling of actively mode-locked diode-pumped Nd:YAG laser," Appl. Phys. S, vol. 69 (1999), pp. 89-91.*

(Continued)

*Primary Examiner*—Minsun Harvey
*Assistant Examiner*—Tod T Van Roy
(74) *Attorney, Agent, or Firm*—Stallman & Pollock LLP

(57) ABSTRACT

A method of intracavity frequency conversion in a CW laser includes causing fundamental radiation to circulate in a laser resonator. The fundamental radiation makes a first pass through an optically nonlinear crystal where a fraction of the fundamental radiation generates second-harmonic radiation in a forward pass through the crystal. The residual fundamental radiation and the second-harmonic radiation are then sum-frequency mixed in forward and reverse passes through an optically nonlinear crystal such that a fraction of each is converted to third-harmonic radiation. The residual second-harmonic radiation and fundamental radiation from the sum-frequency mixing then make a reverse pass through the second-harmonic generating crystal where the second-harmonic radiation is converted back to fundamental radiation. The third harmonic radiation can be delivered from the resonator as output radiation, or can be used to pump another optically nonlinear crystal in an optical parametric oscillator. Second-harmonic radiation can also be used to pump an optical parametric oscillator.

19 Claims, 13 Drawing Sheets

U.S. PATENT DOCUMENTS

| | | | |
|---|---|---|---|
| 6,590,911 B1 * | 7/2003 | Spinelli et al. | 372/22 |
| 6,834,064 B1 * | 12/2004 | Paschotta et al. | 372/30 |
| 6,928,090 B1 * | 8/2005 | Peremans et al. | 372/18 |
| 2002/0191665 A1 * | 12/2002 | Caprara et al. | 372/75 |
| 2002/0196819 A1 * | 12/2002 | Spinelli et al. | 372/21 |

FOREIGN PATENT DOCUMENTS

WO     WO 01/93381 A1 * 12/2001

OTHER PUBLICATIONS

E. Roissé et al., "Intracavity frequency-tripling of actively mode-locked diode-pumped Nd:YAG laser," *Appl. Phys. B,* vol. 69 (1999), pp. 89-91.

K.A. Stankov et al., "A New Mode-Locking Technique Using a Nonlinear Mirror," *Optics Communications,* vol. 66, No. 1, Apr. 1, 1988, pp. 41-46.

* cited by examiner

| Gain Medium | Wave-length (nm) | Crystal Temp. (°C) | Cut Angle $\phi$ | Cut Angle $\theta$ | Spot Size ($\mu$m) | Length (mm) | Doubling Efficiency $\alpha$ (W$^{-1}$) |
|---|---|---|---|---|---|---|---|
| Nd:YVO$_4$ | 1064 | 50 | 10.1 | 90.0 | 40 | 20 | 1.25 10$^{-4}$ |
| Nd:YVO$_4$ | 1064 | 143 | 0.0 | 90.0 | 40 | 20 | 2.54 10$^{-4}$ |
| OPS | 976 | 50 | 16.5 | 90.0 | 40 | 20 | 0.96 10$^{-4}$ |
| OPS | 976 | 298 | 0.0 | 90.0 | 40 | 20 | 3.00 10$^{-4}$ |

| Gain Medium | Wave-length (nm) | Inc. Angle $\gamma$ | Wedge Angle $\alpha$ | Cut Angle $\phi$ | Cut Angle $\theta$ | Spot Size ($\mu$m) | Length (mm) | Tripling Efficiency $\alpha$ (W$^{-1}$) |
|---|---|---|---|---|---|---|---|---|
| Nd:YVO$_4$ | 1064 | 27.7 | 17.3 | 90.0 | 43.0 | 40 | 20 | 3.79 10$^{-4}$ |
| OPS | 976 | 16.9 | 10.7 | 90.0 | 67.7 | 40 | 20 | 1.79 10$^{-4}$ |

| Gain Medium | Wave-length (nm) | Inc. Angle γ | Wedge Angle α | Cut Angle φ | Cut Angle θ | Spot Size (μm) | Length (mm) | Tripling Efficiency α (W⁻¹) |
|---|---|---|---|---|---|---|---|---|
| Nd:YVO₄ | 1064 | 30.7 | 18.7 | 40.5 | 90.0 | 40 | 20 | 11.3 10⁻⁴ |
| OPS | 976 | 24.6 | 15.1 | 58.0 | 90.0 | 40 | 20 | 12.6 10⁻⁴ |

| Gain Medium | Wave-length (nm) | Cut Angle φ | Cut Angle θ | Spot Size (μm) | Length (mm) | Tripling Efficiency α (W⁻¹) |
|---|---|---|---|---|---|---|
| Nd:YVO₄ | 1064 | 90.0 | 180.0 - 31.3 = 148.7 | 40 | 20 | 5.94 10⁻⁴ |
| OPS | 976 | 90.0 | 180.0 - 34.4 = 145.6 | 40 | 20 | 6.41 10⁻⁴ |

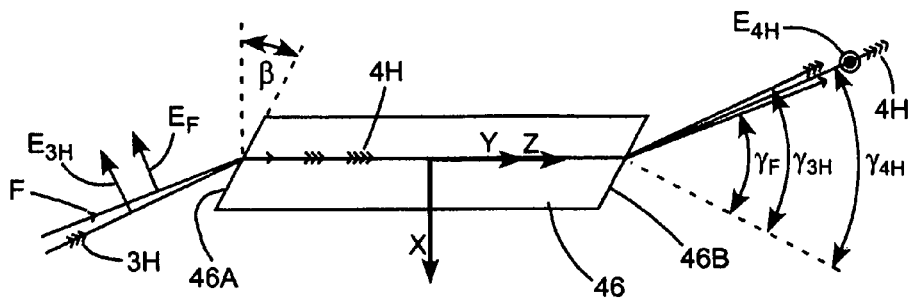
FIG. 13A
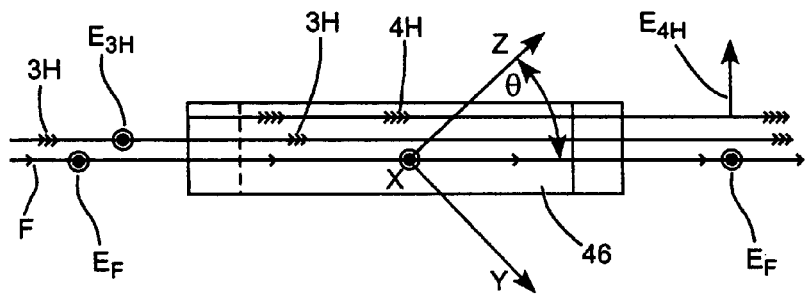
FIG. 13B
| Gain Medium | Wavelength (nm) | Inc. Angle $\gamma_F$ | Inc. Angle $\gamma_{3H}$ | Inc. Angle $\gamma_{4H}$ | Wedge Angle $\beta$ | Cut Angle $\phi$ | Cut Angle $\theta$ | Spot Size (μm) | Length (mm) | Quadrupling Efficiency $\alpha$ (W$^{-1}$) |
|---|---|---|---|---|---|---|---|---|---|---|
| Nd:YVO$_4$ | 1064 | 58.85 | 61.91 | 61.12 | 31.15 | 90.0 | 180 - 40.30 = 139.70 | 40 | 20 | 2.97 10$^{-4}$ |
| OPS | 976 | 58.87 | 62.58 | 61.61 | 31.12 | 90.0 | 180 - 45.43 = 134.57 | 40 | 20 | 2.80 10$^{-4}$ |
FIG. 14

INTRACAVITY FREQUENCY-TRIPLED CW LASER

PRIORITY CLAIM

The present application claims priority to U.S. Provisional Patent Application Ser. No. 60/509,990, filed Oct. 9, 2003, the disclosure of which is incorporated in this document by reference.

TECHNICAL FIELD OF THE INVENTION

The present invention relates generally to harmonic generation in lasers. The invention relates in particular to intracavity generation of third and higher harmonics in a continuous wave (CW) laser.

DISCUSSION OF BACKGROUND ART

Prior art arrangements for intracavity third-harmonic generation in CW lasers result in relatively inefficient conversion of fundamental radiation to the third harmonic. By way of example, ultraviolet (UV) radiation having a wavelength of 355 nanometers (nm) can be generated by frequency doubling fundamental 1064 nm (infrared) radiation in a first optically nonlinear crystal to provide second-harmonic radiation having a wavelength of 532 nm (green radiation), then focusing the 532 nm radiation and the fundamental radiation into a second optically nonlinear crystal to generate the 355 nm radiation. The generated UV power can be estimated, for appropriate focusing of the beams and appropriate choice of propagation direction into the crystal, by an equation:

$$P_{355} = \alpha P_{1064} P_{532} \tag{1}$$

Where $\alpha$ has dimensions of Watts$\times 10^{-1}$ and has dimensions for typical crystals of between about $10^{-5}$ and $10^{-3}$ and where $P_{355}$, $P_{1064}$, and $P_{532}$ are the powers for the UV, infrared (IR) and green radiations respectively. In a Coherent® Verdi™ V10™, intracavity frequency-doubled, diode-pumped, Nd:YVO$_4$ laser, about 350 Watts (W) of IR radiation having a wavelength of about 1064 nm are circulating in a ring-resonator, and about 10 W of green (532 nm) radiation are generated by frequency-doubling the IR radiation in an optically nonlinear crystal of lithium borate (LBO). If a second optically nonlinear crystal of LBO having a length of 20.0 millimeters (mm) were included in the ring-resonator and the IR and green radiation were focused into that crystal, a value of $\alpha$ of $3\times 10^{-4}$ can be achieved and equation (1) predicts that about 1 W of ultraviolet radiation at 355 nm would be generated. This represents a conversion efficiency of pump-power to third harmonic of only about 2.5%. There is a need for an improvement in efficiency for third-harmonic generation in a CW laser.

SUMMARY OF THE INVENTION

In a laser in accordance with the present invention, efficiency of third harmonic conversion in an intracavity frequency tripled CW laser is increased by converting second-harmonic radiation that is not converted to third-harmonic radiation back into fundamental radiation and using that radiation for further harmonic conversion. This improves the third harmonic generating efficiency by a factor of about two or greater.

In one aspect, a laser in accordance with the present invention comprises a standing-wave laser resonator having first and second optically nonlinear crystals located therein. The laser resonator includes a gain-element generating a CW fundamental radiation beam in the resonator. The fundamental radiation circulates in forward and reverse directions in the laser resonator through the optically nonlinear crystals. The first optically nonlinear crystal is arranged to convert a portion of the fundamental radiation propagating therethrough in the forward direction to second-harmonic radiation. The second optically nonlinear crystal is arranged to convert a portion of the second-harmonic radiation propagating therethrough in the forward and reverse directions into radiation having a converted frequency different from the frequency of the second-harmonic radiation. An unconverted portion of the second-harmonic radiation propagating through the first optically nonlinear crystal in the reverse direction is converted back to fundamental radiation.

In one embodiment of the present invention, the second optically nonlinear crystal generates third-harmonic radiation by sum-frequency mixing the fundamental and second harmonic-radiations. In another embodiment of the present invention the second optically nonlinear crystal is collocated in a second resonator and is arranged for optical parametric oscillation of a signal frequency from the second-harmonic radiation.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIG. 13A is an elevation view schematically illustrating details of cut angles and electric-field orientations in one example of an optically nonlinear crystal of BBO arranged for fourth-harmonic generation in the frequency-multiplying method of the present invention.

FIG. 13B is a plan view from below schematically illustrating further details of the BBO crystal of FIG. 13A.

FIG. 14 is table providing exemplary parameters of the crystal of FIGS. 13A and 13B.

DETAILED DESCRIPTION OF THE INVENTION

Figure 1:
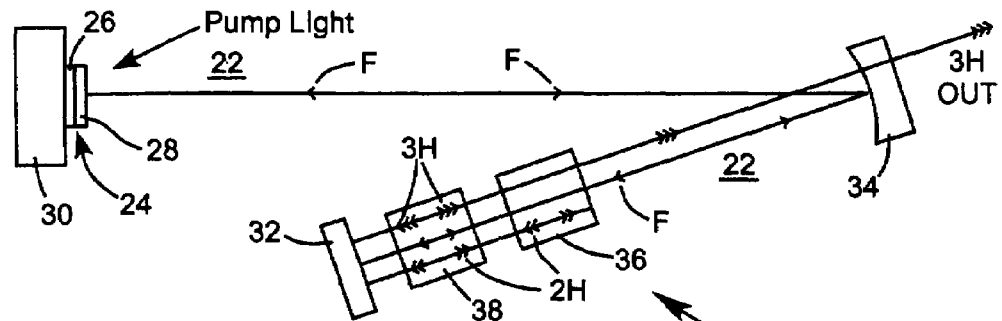
FIG. 1 schematically illustrates a preferred embodiment of an intracavity frequency-tripled, CW laser in accordance with the present invention including a standing-wave resonator formed by a mirror-structure of an OPS-structure, a concave mirror and a plane mirror, the resonator including a gain-structure of the OPS-structure, and two optically nonlinear crystals located between the plane and concave mirrors.

Referring now to the drawings, wherein like components are designated by like reference numerals, FIG. 1 schematically illustrates a preferred embodiment 20 of an OPS-laser embodying the frequency-tripling method of the present invention. Laser 20 includes an OPS-structure 24 including a mirror-structure 26 and a gain-structure 28. The OPS gain-structure is optically pumped by directing pump-light directly into the gain structure. Typically, the pump light is directed at an angle to the path of circulating fundamental radiation F. Arrangements for optically pumping OPS-structures are well known in the art to which the present invention pertains, and a description of such arrangements is not necessary for understanding principles of the present invention. Accordingly, pumping arrangements are not depicted in FIG. 1 for simplicity of illustration, and a detailed description of such arrangements is not presented herein. OPS-structure 24 is usually supported, mirror-structure side down, on a thermally-conductive substrate or an active heat-sink 30. The multilayer gain-structure includes a plurality of very thin (usually less than 200 nm) active or quantum-well (QW) layers (not shown) spaced apart by pump-light-absorbing spacer layers (also not shown). As gain is only provided by the QW-layers, an OPS gain-structure does not suffer from spatial hole burning effects and therefore they can easily be operated in single longitudinal mode with the OPS-structure located anywhere in a standing-wave resonator.

In laser 20, a folded standing-wave resonator 22 is formed between mirror-structure 26 and a plane mirror 32. The resonator is folded by a concave mirror 34. The radius of curvature of mirror 34 and the spacing of mirrors 32 and 34 are selected such that fundamental radiation F circulating in resonator 22 is focused to a narrow beam-waist (not shown) near mirror 32. Optically nonlinear crystals 36 and 38 are located in resonator 22 close to mirror 32, i.e., as close as possible to the beam-waist, and are arranged such that the circulating fundamental radiation traverses the crystals in turn.

A fraction of the fundamental radiation traversing crystal 36, on a first (forward) pass therethrough, is converted to second-harmonic (2H or green) radiation as indicated by double arrow 2H. Optically nonlinear crystal 38 is arranged such that some fraction of the 2H-radiation and some fraction of fundamental radiation traversing the crystal on a first pass therethrough are sum-frequency mixed to provide third-harmonic radiation as indicated by triple arrows 3H. By way of example, between about 3% and 10% of the fundamental radiation may be converted to second-harmonic radiation. The fundamental radiation, residual 2H-radiation, and the 3H-radiation are reflected from mirror 32 and make a second (reverse) pass through optically nonlinear crystal 38, in an opposite direction to the first pass, thereby generating more 3H-radiation. The fundamental radiation, residual 2H-radiation, and the 3H-radiation make a second pass through optically nonlinear crystal 36 in an opposite direction to the first pass. Optically nonlinear crystal 38 is arranged with respect to crystal 36 such that 2H-radiation entering crystal 36, together with fundamental radiation, has a phase relationship with the fundamental radiation that causes the 2H-radiation to be converted back to fundamental radiation. Mirror 34 is coated to be highly reflective for fundamental radiation and highly transmissive for 3H-radiation. This allows 3H-radiation to be delivered from resonator 22 as output radiation. The phase relationship for fundamental and 2H-radiation and the back conversion mechanism are described briefly as follows.

In conventional second-harmonic generation in an optically nonlinear crystal, the generated 2H-radiation lags in phase by 90° with respect to a nonlinear electronic polarization induced by the fundamental radiation. If 2H-radiation is presented at the input of an optically nonlinear crystal together with fundamental radiation, and if the 2H-radiation leads (rather than lags) in phase by 90° the nonlinear polarization induced by the fundamental, then the 2H-radiation generated in the crystal from the fundamental is in opposition of phase with respect to the 2H-radiation entering the crystal. Because of this, cancellation of the input 2H-radiation field takes place with concurrent transfer of the 2H-energy to the fundamental field.

One preferred means of achieving the required phase relationship is to use optically nonlinear crystal 38 as a variable phase retarder. Third-harmonic generation in the crystal is optimum at a particular phase-matching angle that is different for different temperatures of the crystal. Accordingly, there is an infinitely variable range of pairs of temperature and phase-matching angles that will provide optimum third-harmonic generation. The phase relationship of unconverted fundamental and 2H-radiation leaving the crystal will be different for different pairs of temperature and phase-matching angle. Crystal 38 can be located in a temperature controlled oven (not shown) and the temperature and phase-matching angle varied until third-harmonic generation in optically nonlinear crystal 38 and back conversion of 2H-radiation to fundamental radiation in optically nonlinear crystal 36 are optimized. By way of example, in a BBO crystal having a length of about 15.0 mm the phase relationship between fundamental and 2H radiation exiting the crystal varies by about $\pi/20$ radians per degree Celsius.

Back-conversion of 2H-radiation in crystal 36 considerably reduces overall losses in resonator 22 seen by the fundamental radiation. This allows circulating fundamental radiation to grow to substantially higher intensity levels than are possible in the absence of back conversion. The higher fundamental-radiation intensity provides that a higher 2H-radiation intensity is generated by optically nonlinear crystal 36. The higher fundamental and 2H-radiation intensities in optically nonlinear crystal 36 provide for higher third-harmonic-radiation intensity than in prior-art lasers in which second-harmonic back-conversion does not occur. Power is coupled out of resonator 22 essentially only as 3H-radiation. The term "essentially", here, meaning that unavoidable parasitic linear losses in the resonator are discounted. Numerical simulations predict that as much as about 10.0 W or more of UV (3H) radiation can be generated in a standing wave OPS laser wherein the gain-medium is diode-pumped with about 60.0 Watts of 808 nm pump radiation.

It is important that all resonator mirrors be coated for maximum reflectivity (for example greater than about 99% reflectivity) at the wavelength of fundamental radiation, so that fundamental radiation is trapped inside the resonator. In this way, fundamental-radiation intensity in the resonator is maximized. If fundamental radiation intensity is not maximized, and in particular, if significant delivery of fundamental radiation from a resonator via mirror 32 takes place, this could cause the resonator to act in a passively-modelocked, pulsed manner, thereby defeating an object of the present invention to deliver only CW radiation.

Figure 2:
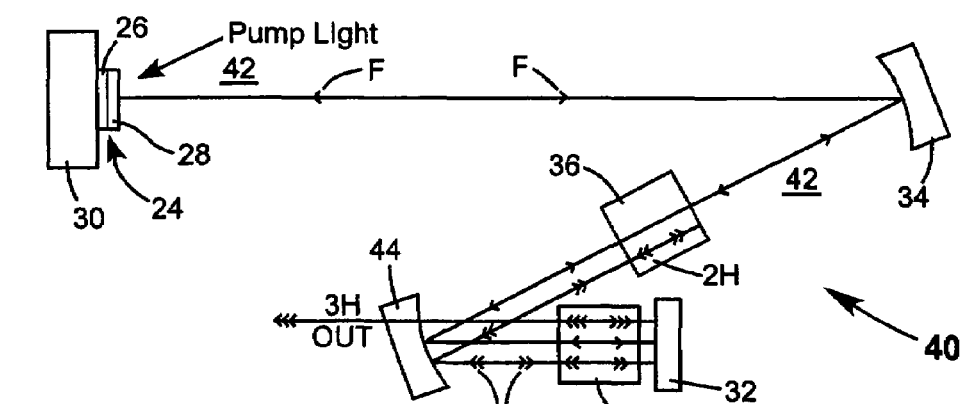
FIG. 2 schematically illustrates another preferred embodiment of an intracavity frequency-tripled, CW laser in accordance with the present invention, including a standing-wave resonator formed by a mirror-structure of an OPS-structure, two concave mirrors, and a plane mirror, the resonator including a gain structure of the OPS-structure, and two optically nonlinear crystals, one thereof located between the two concave mirrors and the other thereof located between the plane mirror and one of the concave mirrors.

A shortcoming of laser 20 is that optically nonlinear crystals 36 and 38 cannot all be optimally positioned at the fundamental beam-waist near mirror 32 because of the length and spacing of the crystals relative to the Rayleigh range of the beam-waist. FIG. 2 schematically depicts another embodiment 40 of a laser in accordance with the present invention that remedies this shortcoming by forming a standing-wave resonator 42 having a separate beam-waist for each of the optically nonlinear crystals. Here again, optical pumping arrangements are omitted from the drawing for convenience of illustration.

Resonator 42 is formed between plane mirror 32 and mirror-structure 36 of OPS-structure 34, with gain-structure 38 of the OPS-structure located in the resonator. The resonator is twice-folded by concave mirrors 34 and 44. The radius of curvature and spacing of mirrors 34 and 44 are selected such that fundamental radiation F circulating in resonator 42 is focused to a narrow beam-waist (not shown) about midway between the mirrors. Optically nonlinear crystal 36 is located at the beam-waist position. The radius of curvature of mirror 44 and the spacing of mirrors 44 and 32 are selected are selected such that fundamental radiation F circulating in resonator 42 is focused to a narrow beam-waist at mirror 32. Optically nonlinear crystal 38 is located in resonator 42 as close as is practical to mirror 32, i.e., as close as is practical to the beam-waist position.

The second-harmonic generation and back-conversion process and the third-harmonic generation process is similar to that discussed above with reference to laser 20. A fraction of the fundamental radiation traversing crystal 36 on a first pass therethrough is converted to 2H-radiation. 3H-radiation is generated on a forward and reverse pass through optically nonlinear crystal 38 by fundamental and 2H-radiations. The 3H-radiation exits resonator 42 via mirror 44. Fundamental radiation and residual 2H-radiation are reflected from mirror 44 and make a second pass through optically nonlinear crystal 36 in an opposite direction to the first pass. 2H-radiation is converted back to fundamental radiation on the second pass through optically nonlinear 36.

Figure 3:
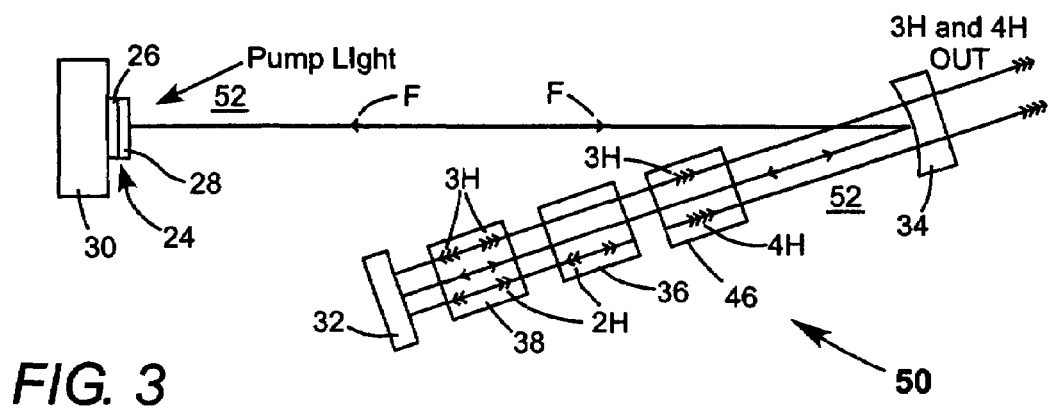
FIG. 3 schematically illustrates another preferred embodiment of an intracavity frequency-quadrupled, CW laser in accordance with the present invention, including a standing-wave resonator formed by a mirror-structure of an OPS-structure, a concave mirror and a plane mirror, the resonator including a gain-structure of the OPS-structure, and three optically nonlinear crystals being located between the plane and concave mirrors.

FIG. 3 schematically illustrates an OPS-laser 40 in accordance with the present invention arranged to generate fourth-harmonic radiation (4H-radiation) by the inventive method. Laser 50 is similar to laser 20 of FIG. 1 inasmuch as it includes a folded standing-wave resonator 22 formed between plane mirror 32 and mirror-structure 36 of OPS-structure 24, with gain structure 28 of the OPS-structure located in the resonator. Resonator 22 is folded by a concave mirror 34. Laser 50, however, includes a third optically nonlinear crystal 46, arranged to generate 4H-radiation from fundamental radiation and 3H-radiation Located between the plane mirror 32 and concave mirror 34 are optically nonlinear crystals 36, 38, and optically nonlinear crystal 46. Fundamental radiation passes through optically nonlinear crystal 46 on a first pass without being converted to any harmonic frequency. A fraction of the fundamental radiation traversing crystal 36 on a first pass therethrough is converted to 2H-radiation. 3H-radiation is generated on a forward and reverse pass through optically nonlinear crystal 38 by fundamental and 2H-radiations. Fundamental radiation, residual 2H-radiation and 3H-radiation are reflected from mirror 44 and make a second pass through optically nonlinear crystal 36 in an opposite direction to the first pass. 2H-radiation is converted back to fundamental radiation on the second pass through optically nonlinear crystal 36. The fundamental and 3H-radiations traverse optically nonlinear crystal 46 on a second pass therethrough, in an opposite direction to the first pass, and are mixed in the crystal to generate 4H-radiation. 4H-radiation and residual 3H-radiation exit resonator 22 via mirror 34.

It is pointed out here that in FIGS. 1, 2, and 3, fundamental and harmonic radiations are indicated (for purposes of highlighting the inventive harmonic generating and re-conversion process) as being on separate paths, while, in practice, the fundamental and second harmonic radiations will usually follow a common path. In all other drawings herein, the fundamental and harmonic radiations are depicted as being on a common path where that is the case. Fundamental, 2H, 3H and 4H-radiations continue to be designated by single, double, triple and quadruple arrowheads respectively.

Figure 4:
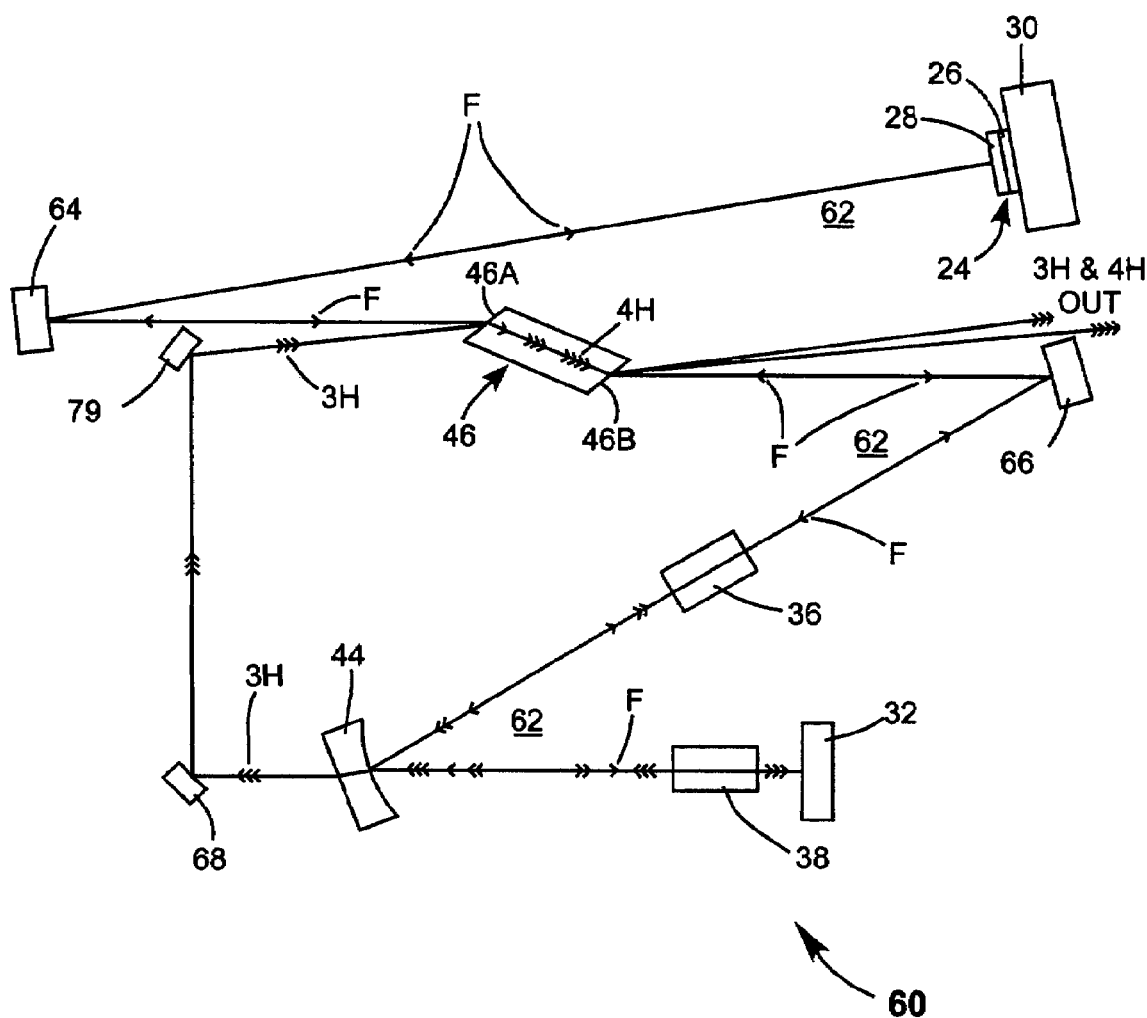
FIG. 4 schematically illustrates still yet another preferred embodiment of an intracavity frequency-quadrupled, CW laser in accordance with the present invention, including a standing-wave resonator formed by a mirror-structure of an OPS-structure, three concave mirrors and a plane mirror, the resonator including a gain structure of the OPS-structure, and three optically nonlinear crystals, two thereof separately located between pairs of the concave mirrors, and the other thereof located between the plane mirror and one of the concave mirrors.

Laser 50 has a similar shortcoming to laser 20, inasmuch as optically nonlinear crystals 36, 38 and 46 can not all be optimally positioned at the fundamental beam-waist near mirror 32, because of the length and spacing of the crystals relative to the Rayleigh range of the beam-waist. FIG. 4 schematically depicts an embodiment 60 of a laser in accordance with the present invention that remedies this shortcoming by forming a standing-wave resonator 62 having a separate fundamental beam-waist for each of the optically nonlinear crystals. Once more, optical pumping arrangements are omitted from the drawing for convenience of illustration.

Resonator 62 is formed between plane mirror 32 and mirror-structure 26 of OPS-structure 24, with gain-structure 28 of the OPS-structure located in the resonator. The resonator is thrice folded by concave mirrors 64, 66, and 44. The radius of curvature and spacing of mirrors 64 and 66 are selected such that fundamental radiation F circulating in resonator 62 is focused to a narrow beam-waist (not shown) about midway between the mirrors. Optically nonlinear crystal 46, the fourth-harmonic generating crystal, is located at the beam-waist position between these mirrors. Entrance and exit faces 46A and 46B of crystal 46 are parallel to each other and are cut at an angle to the longitudinal axis of the crystal. Fundamental radiation enters and exits the crystal at a non-normal incidence angle to these faces. A more detailed description of preferred crystal-cut angles, crystal-face cut-angles, and radiation incidence angles is presented further hereinbelow.

The radius of curvature and spacing of mirrors 66 and 44 are selected such that the fundamental radiation is also focused to another narrow beam-waist about midway between the mirrors. Optically nonlinear crystal 36, the second-harmonic generating and reconverting crystal is located at this beam-waist location. The radius of curvature of mirror 44 and the spacing of mirrors 44 and 32 are selected such that fundamental radiation F circulating in resonator 62 is focused to yet another narrow beam-waist at mirror 32. Optically nonlinear crystal 38 is located in resonator 62 as close as is practical to mirror 32, i.e., as close as is practical to the beam-waist position.

Fundamental radiation passes through optically nonlinear crystal 46 on a first pass therethrough without being converted to any harmonic frequency. A fraction of the fundamental radiation traversing crystal 36 on a first pass therethrough is converted to 2H-radiation. 3H-radiation is generated on a forward and reverse pass through optically nonlinear crystal 38 by fundamental and 2H-radiations. Fundamental radiation and residual 2H-radiation are reflected from mirror 44 and make a second pass through optically nonlinear crystal 36 in an opposite direction to the first pass. 2H-radiation is converted back to fundamental radiation on the second pass through optically nonlinear crystal 36.

3H-radiation generated by the double pass of fundamental and 2H-radiation through optically nonlinear crystal 38 exits resonator 62 via mirror 44. The 3H-radiation is then directed by mirrors 68 and 70 into optically nonlinear crystal 46 via entrance face 46A thereof. The crystal has a higher refractive index for 3H-radiation than for fundamental radiation, and the 3H-radiation enters the crystal at an angle to the fundamental radiation, the angle being selected such that the fundamental and 3H-radiations follow the same path in the crystal, parallel to the longitudinal axis thereof. 4H-radiation is generated by the coaxial passage of the fundamental and 3H-radiations through optically nonlinear crystal 46. 3H and 4H-radiations exit optically nonlinear crystal 46 through exit face 46B thereof at an angle to the fundamental radiation and at an angle to each other. This makes it possible for 3H and 4H-radiations to exit resonator 62 without passing through any resonator components.

A description of optically nonlinear crystal design and conversion efficiency estimates for the frequency conversion method of the present invention is next set forth. For efficiency estimates, power generated in second-harmonic generation (SHG) can be approximated by an equation:

$$P_{2H} = \alpha_{SHG} P^2_F \qquad (2)$$

where $P_{2H}$ is the second harmonic power, $P^2_F$ is the fundamental power squared, and $\alpha_{SHG}$ is a conversion coefficient, having a dimension of inverse Watts ($W^{-1}$) as discussed above. The power generated in third-harmonic generation (THG) can be approximated by an equation:

$$P_{3H} = \alpha_{THG} P_F P_{2H} \qquad (3)$$

where $P_{3H}$ is the third harmonic power. The conversion coefficient $\alpha_{THG}$ can be computed for the specified beam sizes, and for different optically nonlinear crystal materials and lengths, using Boyd-Kleinman computations.

Figures 5, 6:
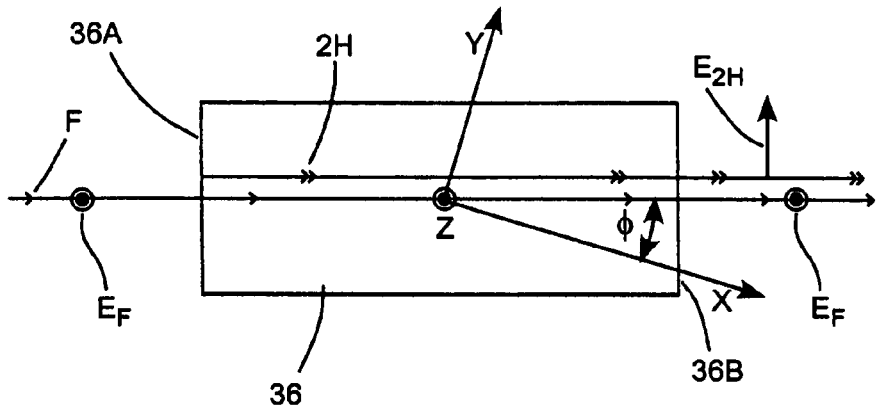
FIG. 5 schematically illustrates details of cut angles and electric-field orientations in one example of an optically nonlinear crystal of LBO arranged for second-harmonic generation and back-conversion in the frequency-multiplying method of the present invention.
FIG. 6 is table providing exemplary parameters of the crystal of FIG. 5 for two different crystal temperatures.

In any of the above described embodiments of lasers in accordance with the present invention including an OPS-gain structure providing fundamental radiation F at a wavelength of 976 nm, an optically nonlinear crystal of LBO is preferred for second-harmonic generation and back-conversion, i.e., for optically nonlinear crystal 34. Details of cut angles and electric-field orientations in one example of an optically nonlinear crystal 36 of LBO arranged for second-harmonic generation and back-conversion are schematically depicted in FIG. 5. Cut angles include an angle θ, which is the angle of the crystalline Z axis with the longitudinal axis of the crystal, and is not specifically designated in FIG. 5, and an angle φ, which is the angle of the crystalline X axis with the longitudinal axis of the crystal. Crystal entrance and exit faces 36A and 36B respectively are, here, perpendicular to the longitudinal axis and to incident fundamental radiation F. The electric field (polarization) of the fundamental radiation (single arrows) is perpendicular to the plane of the drawing as indicated by arrowhead $E_F$. The electric field (polarization) of the 2H-radiation (double arrows) is in the plane of the drawing, perpendicular to the polarization plane of the fundamental radiation as indicated by $E_{2H}$. In FIG. 6, a table provides examples of values of crystal temperature, cut angles, fundamental beam size in the crystal, and computed second-harmonic generating (doubling) efficiency for a crystal having a length of twenty millimeters (20.0 mm), and for a fundamental wavelengths of 976 nm and 1064 nm, the latter wavelength being a fundamental wavelength of neodymium-doped yttrium vanadate (Nd:YVO$_4$).

Figures 7, 8:
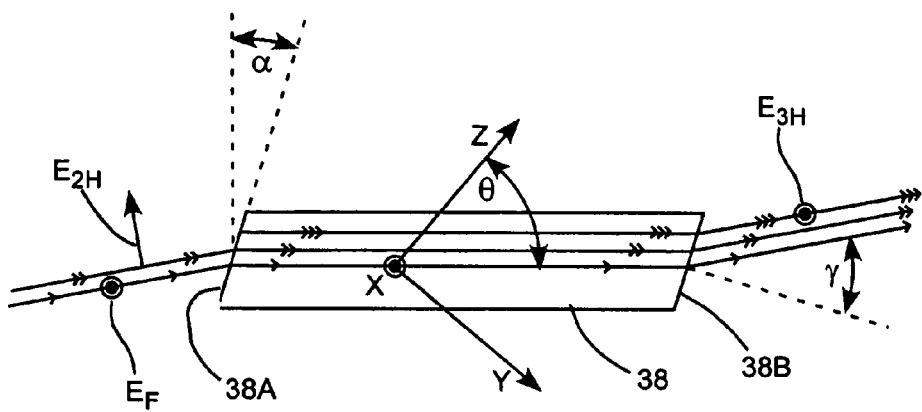
FIG. 7 schematically illustrates details of cut angles and electric-field orientations in one example of an optically nonlinear crystal of LBO arranged for third-harmonic generation in the frequency-multiplying method of the present invention.
FIG. 8 is table providing exemplary parameters of the crystal of FIG. 7.

Preferred optically nonlinear crystals for third-harmonic generation in any of the above described embodiments of lasers in accordance with the present invention wherein fundamental radiation has a wavelength of 976 nm include LBO cesium borate (CBO) and BBO. Details of cut angles and electric-field orientations in one example of an optically nonlinear crystal 38 of LBO arranged for third-harmonic generation are schematically depicted in FIG. 7. Cut angles include an angles θ and φ, are as defined above with reference to FIG.

5. Crystal entrance and exit faces 38A and 38B respectively are parallel to each other, here, at a wedge angle α to the longitudinal axis. Fundamental radiation F and second-harmonic radiation 2H are incident on face 38A at an angle such that the radiations travel parallel to the longitudinal axis of the crystal and exit face 38B at the same angle (the incidence angle) γ. The electric field (polarization) of the fundamental radiation (single arrows) is perpendicular to the plane of the drawing as indicated by arrowhead $E_F$. The electric field (polarization) of the 2H-radiation (double arrows) is perpendicular to the polarization plane of the fundamental radiation as indicated by $E_{2H}$. The polarization of 3H-radiation (triple arrows) is perpendicular to the polarization of 2H-radiation. In FIG. 8, a table provides examples of values of cut angles, wedge and incidence angles, fundamental beam size in the crystal, and computed third-harmonic generating (tripling) efficiency for a LBO crystal having a length of twenty millimeters, at fundamental wavelengths 976 nm and 1064 nm.

Figures 9, 10:
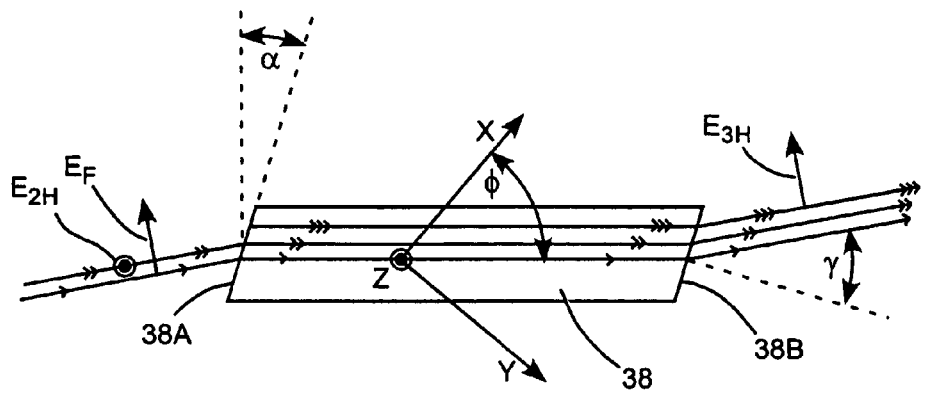
FIG. 9 schematically illustrates details of cut angles and electric-field orientations in one example of an optically nonlinear crystal of CBO arranged for third-harmonic generation in the frequency-multiplying method of the present invention.
FIG. 10 is table providing exemplary parameters of the crystal of FIG. 9.

Details of cut angles and electric-field orientations in one example of an optically nonlinear crystal 38 of CBO arranged for third-harmonic generation are schematically depicted in FIG. 9. Here, for consistency of numbering with third-harmonic-generating crystals in above-described inventive lasers, the crystal is still designated by numeral 38, even though it is differently cut and is of a different material from the crystal of FIG. 7. The crystal has parallel faces 38A and 38B at the wedge angle α to the longitudinal axis of the crystal. The electric field (polarization) of the fundamental radiation is in the plane of the drawing as indicated by arrow $E_F$. The electric field (polarization) of the 2H-radiation is perpendicular to the polarization of the fundamental radiation as indicated by arrowhead $E_{2H}$. The polarization of 3H-radiation (triple arrows) is perpendicular to the plane of 2H-radiation. In FIG. 10, a table provides examples of values of cut angles, wedge and incidence angles, fundamental beam size in the crystal, and computed third-harmonic generating (tripling) efficiency for a CBO crystal having a length of twenty millimeters, at a fundamental wavelength 976 nm and 1064 nm.

Figures 11, 12:
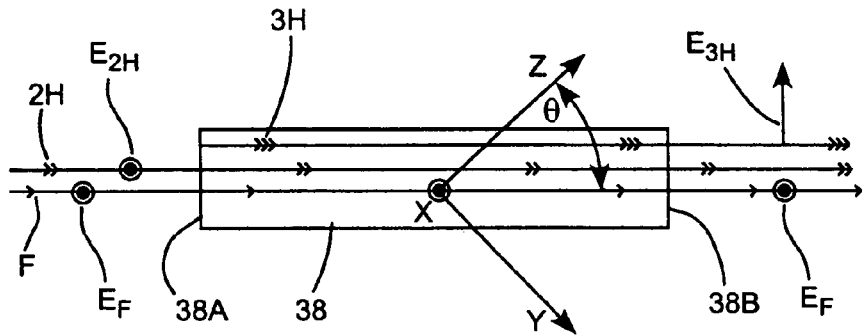
FIG. 11 schematically illustrates details of cut angles and electric-field orientations in one example of an optically nonlinear crystal of BBO arranged for third-harmonic generation in the frequency-multiplying method of the present invention.
FIG. 12 is table providing exemplary parameters of the crystal of FIG. 11.

FIG. 11 schematically depicts details of cut angles and electric-field orientations in one example of an optically nonlinear crystal 38 of BBO arranged for third-harmonic generation. Here again, for consistency of numbering with third-harmonic generating crystals in above described inventive lasers, the crystal is still designated by numeral 38, even though it is differently cut and is of a different material from the crystal of FIG. 7. Exit and entrance faces 38A and 38B, respectively, are perpendicular to the longitudinal axis of the crystal. Fundamental and 2H-radiations are normally incident on the exit and entrance faces. The polarizations of the fundamental radiation and 2H-radiation are perpendicular to the plane of the drawing as indicated by arrowheads $E_F$ and $E_{2H}$. The polarization of 3H-radiation is perpendicular to the polarizations of 2H-radiation and fundamental radiation. In FIG. 12, a table provides examples of values of cut angles, fundamental beam size in the crystal, and computed third-harmonic generating (tripling) efficiency for a BBO crystal having a length of twenty millimeters, at fundamental wavelengths of 976 nm and 1064 mm.

FIG. 13A and FIG. 13B schematically depict details of cut angles and electric-field orientations in one example of an optically nonlinear crystal 46 of BBO arranged for fourth-harmonic generation. Here, fundamental and 3H-harmonic radiations are incident on entrance face 46A of the crystal at an angle to each other and at incidence angles $\gamma_F$ and $\gamma_{3H}$ selected such both the fundamental and 3H-radiations traverse crystal 46 parallel to the longitudinal axis of the crystal. As entrance face 46A and exit face 46B are parallel to each other, the fundamental and 3H-radiations leave exit face 46B of crystal 46 at the same respective (external) incidence angles, and with the same angular separation. Generated 4H-radiation (quadruple arrows) leaves exit face 46B of crystal 46 at an incidence angle $\gamma_{4H}$ between $\gamma_F$ and $\gamma_{3H}$. The fundamental and 3H-radiations enter the crystal with polarizations parallel to each other. Generated 4H-radiation is polarized perpendicular to the polarization of the fundamental and 3H-radiations. In FIG. 14, a table provides examples of values of cut angles, incidence angles $\gamma_F$, $\gamma_{3H}$, and $\gamma_{4H}$, fundamental beam size in the crystal, and computed fourth-harmonic generating (quadrupling) efficiency for a BBO crystal having a length of twenty millimeters, at fundamental wavelengths 976 nm and 1064 nm.

Having estimated the conversion efficiency of various optically nonlinear crystal materials and crystal configurations, the harmonic power generated for above described embodiments of the inventive lasers can be computed.

TABLE 1 lists calculated 3H-radiation power generated in an OPS-laser in accordance with above-described laser 40 of FIG. 2, wherein fundamental radiation generated by the OPS gain-structure 38 has a wavelength of about 976 nm. It is assumed, here, that the second-harmonic generation and re-conversion crystal 36 is an LBO crystal cut as depicted in FIG. 5 and having a single-pass length of 10 mm. It is also assumed that the fundamental spot size in both of the optically nonlinear crystals is 40 μm, and that the third-harmonic harmonic generating crystal 38 has a double-pass length of 20.0 mm. It is further assumed that 80% of generated 2H-radiation is converted back to fundamental radiation. Third harmonic generating crystals of LBO, CBO, and BBO are assumed to be cut and arranged as depicted in FIGS. 7, 9, and 11 respectively. A numerical code used to perform the harmonic-power power computations for this and a following example of OPS-laser embodiments of the present invention includes radial integrations to account for the transverse fundamental beam profile (assumed Gaussian), and also takes into account the effect of beam shape aberrations and diffraction.

TABLE 1

| Pump Power (Watts @ 810 nm) | Spot Size in OPS (μm) | THG Crystal material (double pass L 20 mm) | Circulating Fundamental Power (Watts) | Generated 2H-Power (Watts) | Generated 3H-Power @325 nm |
|---|---|---|---|---|---|
| 20 | 252 | LBO | 267.90 | 6.92 | 0.32 |
| 40 | 358 | LBO | 469.10 | 20.85 | 1.64 |
| 60 | 438 | LBO | 630.00 | 37.09 | 3.86 |
| 20 | 252 | CBO | 241.80 | 5.65 | 1.65 |
| 40 | 358 | CBO | 383.50 | 14.03 | 6.40 |
| 60 | 438 | CBO | 481.90 | 21.98 | 12.49 |
| 20 | 252 | BBO | 255.00 | 6.28 | 0.98 |
| 40 | 358 | BBO | 422.30 | 16.96 | 4.32 |
| 60 | 438 | BBO | 544.40 | 27.90 | 9.06 |

TABLE 2 lists calculated 4H-radiation power generated in an OPS-laser in accordance with above-described laser 50 of FIG. 3, wherein fundamental radiation generated by the OPS gain-structure 38 has a wavelength of about 976 nm. Here yet again, it is assumed that the second-harmonic generation crystal 36 is an LBO crystal cut as depicted in FIG. 5. It is also assumed that the fundamental spot size in all of the optically nonlinear crystals is 40 μm, and that second-harmonic generating crystal 34 has a single pass length of 10 mm, third-harmonic generating crystal 36 has a double pass length of 20 mm, and fourth harmonic generating crystal 41 has a single pass length of 20 mm. It is further assumed that 80% of generated 2H-radiation is converted back to fundamental radiation. Third-harmonic generating crystals of LBO, CBO, and BBO are assumed to be cut and arranged as depicted in FIGS. 7, 9, and 11 respectively. Fourth-harmonic generating crystal 46 is assumed to be a BBO crystal, cut and arranged as depicted for crystal 46 of FIGS. 13A and 13B.

TABLE 2

| Pump Power (Watts @ 810 nm) | Spot Size in OPS (μm) | THG Crystal material (double pass L 20 mm) | Circulating Fundamental Power (Watts) | Generated 2H- Power (Watts) | Generated 3H- Power (Watts) | Generated 3H- Power (Watts @ 244 nm) |
|---|---|---|---|---|---|---|
| 20 | 252 | LBO | 267.70 | 6.91 | 0.32 | 0.02 |
| 40 | 358 | LBO | 468.20 | 20.77 | 1.63 | 0.20 |
| 60 | 438 | LBO | 627.60 | 36.82 | 3.82 | 0.62 |
| 20 | 252 | CBO | 241.40 | 5.63 | 1.64 | 0.11 |
| 40 | 358 | CBO | 381.60 | 13.90 | 6.31 | 0.63 |
| 60 | 438 | CBO | 478.30 | 21.66 | 12.22 | 1.52 |
| 20 | 252 | BBO | 254.70 | 6.26 | 0.98 | 0.07 |
| 40 | 358 | BBO | 420.60 | 16.83 | 4.27 | 0.47 |
| 60 | 438 | BBO | 540.80 | 27.55 | 8.89 | 1.25 |

It is appears from the computed third and fourth-harmonic powers of TABLES 1 and 2, that in all exemplified embodiments of lasers incorporating the inventive third-harmonic generation scheme, the highest conversion efficiency of pump-power to generated third or fourth harmonic power is achieved when an optically nonlinear crystal of CBO is used for third-harmonic generation. In practice, however, BBO is preferred as providing a good compromise between conversion efficiency and availability of good quality crystals.

Calculations corresponding to the calculations of TABLES 1-2 for OPS lasers not including the inventive back-conversion of CW 2H-radiation indicate that the frequency-conversion method of the present invention can provide an efficiency improvement over that of prior-art lasers for third and fourth-harmonic generation ranging from about a factor of two, at lower (about 20 W) pump power, to three or more at higher (60 W or more) pump power. This efficiency improvement is about the same for fourth-harmonic generation as for third-harmonic generation as it is primarily the efficiency improvement for third-harmonic generation that provides the efficiency improvement for fourth-harmonic generation. Those skilled in that art will recognize, for this reason alone, that similar efficiency increases in fifth and higher-harmonic generation could be realized by including one or more additional optically nonlinear crystals in above-described and other embodiments of the inventive lasers.

Figure 15:
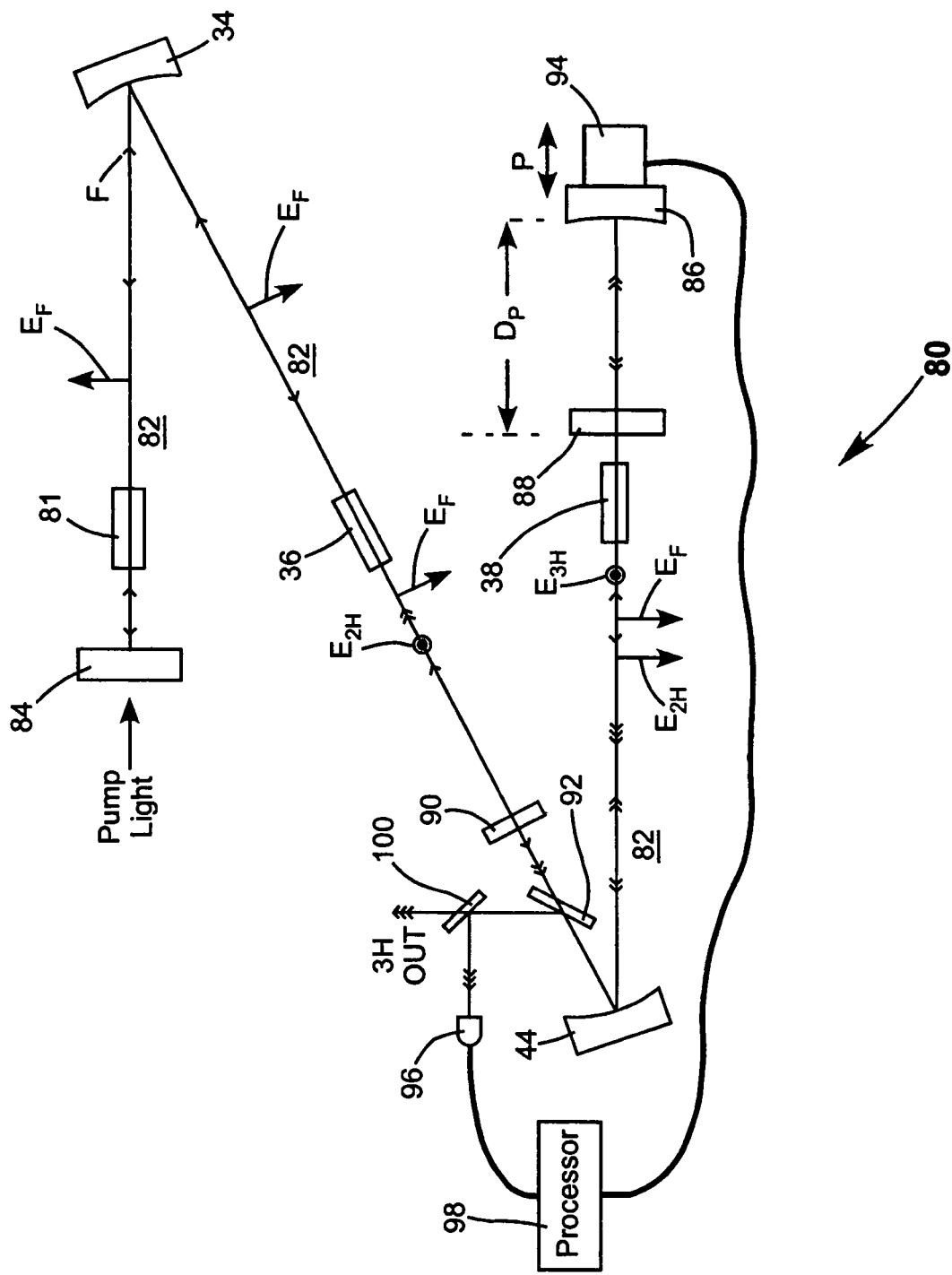
FIG. 15 schematically illustrates a further embodiment of an intracavity frequency-tripled, CW laser in accordance with the present invention, having a folded standing-wave resonator including a solid state gain-element, two optically nonlinear crystals and a pair of mirrors arranged to provide a path difference between fundamental and second harmonic radiation.

All embodiments of lasers in accordance with the present invention discussed above employ a multilayer semiconductor gain-structure for providing fundamental radiation. However, a solid-state gain medium, such as NdYVO$_4$, may also be used for generating fundamental radiation in the inventive laser. FIG. 15 schematically illustrates a laser 80 in accordance with the present invention. Laser 80 is similar to laser 40 of FIG. 2 but includes a solid-state gain-element 81 rather than an OPS-structure. Laser 80 includes a fundamental laser resonator 82 formed by a plane mirror 84, two concave fold mirrors 34 and 44, and a plane mirror 88. Gain element 81 is end pumped by pump light delivered through mirror 84. A plane mirror 86 is located outside resonator 82, spaced apart by a distance D$_P$ from mirror 88. Mirror 84, is coated for maximum reflectivity at the wavelength of fundamental radiation F, and for high transmissivity, for example greater than about 98%, at the wavelength of the pump light. Mirrors 33 and 44 are coated for maximum reflectivity at the wavelength of fundamental radiation F. Mirror 88 is coated for maximum reflectivity at the wavelengths of fundamental and 3H-radiation, and for high transmissivity at the 2H-radiation wavelength. Mirror 86 is coated for maximum reflectivity of the 2H-radiation. The spacing between mirrors 86 and 88 is adjustable as indicated in FIG. 15 by double arrows P. Adjustment is preferably accomplished by a piezoelectric actuator 94.

A preferred material for gain element 81 is NdYVO$_4$. This material, in crystal form has a strongly polarization-dependent optical gain and in laser resonator will generate plane polarized radiation in the polarization orientation in which the gain is highest. In laser 80, fundamental gain-element 81 is oriented such that fundamental radiation is polarized parallel to the plane of incidence of laser radiation on mirrors 34 and 44, which, here, is the plane of the drawing. The polarization orientation is indicated in FIG. 15 by arrows E$_F$. Fundamental radiation traverses optically nonlinear crystal 36 and generates 2H-radiation as indicated in FIG. 15 by double arrowheads. The polarization orientation of the 2H-radiation (indicated by arrow E$_{2H}$) is at 90° to the orientation of the fundamental radiation. Fundamental and 2H-radiations traverse a polarization rotator (waveplate) 90. Waveplate 90 is configured to rotate the polarization plane of the 2H-radiation by an odd integer multiple of half-wavelengths of the 2H-radiation and to rotate the polarization plane of the fundamental radiation by an integer multiple of wavelengths of the fundamental radiation. Accordingly, after traversing waveplate 90, both the fundamental and 2H-radiations are polarized parallel to the plane of the drawing.

Fundamental and 2H-radiations traverse optically nonlinear crystal 38 generating 3H-radiation (indicated in FIG. 15 by triple arrowheads). The 3H-radiation is reflected from mirror 88 back through optically nonlinear crystal 38. The polarization orientation of the 3H-radiation (indicated by arrow E$_{3H}$) is at 90° to the orientation of the fundamental and 2H-radiations. 2H-radiation reflected from mirror 86 and fundamental radiation reflected from mirror 88 traverse optically nonlinear 38, again generating 3H-radiation, thereby adding to that 3H radiation previously generated and reflected from mirror 88.

Fundamental 2H, and 3H radiations are reflected from mirror 44. The 3H-radiation is directed out of resonator 82 by a dichroic beamsplitter 92. Residual fundamental and 2H-radiations traverse waveplate 90, which causes the polarization planes of the fundamental and 2H-radiations to be once again at 90° to each other. In this relative polarization orientation, and in the desired phase relationship with each other, most of the 2H radiation is converted back to fundamental radiation.

In the arrangement of resonator 82 of laser 80, path difference D$_P$ and accordingly the relative phase of the fundamental and 2H-radiation, is directly adjustable by varying the position of mirror 86 with respect to mirror 88 via PZT actuator 94. A full 2π variation of the relative phase of fundamental and 2H-radiation can be accomplished by a change in spacing of the mirrors of only about 275 nm. This provides that the range of motion is well within the range of motion possible using actuator 94. Further, as a change in spacing can be effected via PZT actuator 94 in less than a few millisecond (ms), the phase adjusting method lends itself to closed-loop control.

One method of effecting such closed loop control is to direct a sample portion, for example about 1%, of output, 3H-radiation via a beamsplitter 100 to a detector 96, such as a photodiode. The output of detector 96 is proportional to the 3H output power of laser 80. The detector output is connected to a processor 98. Processor 98 commands PZT actuator 94 to move mirror 86 reciprocally as indicated by arrow P while monitoring the resulting change in output of detector 96. This enables the processor to determine the direction in which mirror should be moved to optimize 3H output power, this optimization resulting, inter alia, from an optimization of the phase relationship of fundamental and 2H-radiation re-entering optically nonlinear crystal 36.

Optimum conversion of 2H-radiation occurs in an optically nonlinear crystal when the phase of 2H-radiation leads (rather than lags) in phase by 90° the nonlinear electronic polarization induced by the fundamental, as discussed above. One method of controlling the relative phase of the fundamental and 2H-radiations in embodiments of the present invention, also discussed above, is to vary the temperature of the optically nonlinear crystal (crystal 38 in all embodiments) used for mixing fundamental and 2H-radiations to provide 3H-radiation. While effective, this method of phase control is slow in response and requires a compensating variation of phase-angle with variation of crystal temperature. In laser 80, this phase relationship can be self-selected by the laser because of a path difference ($2 \times D_P$) between the 2H and fundamental radiations created by the spacing of mirrors 86 and 88. A description of this phase self-selection mechanism is set forth below with continuing reference to FIG. 15, and with reference, in addition, to FIG. 16.

Figure 16:
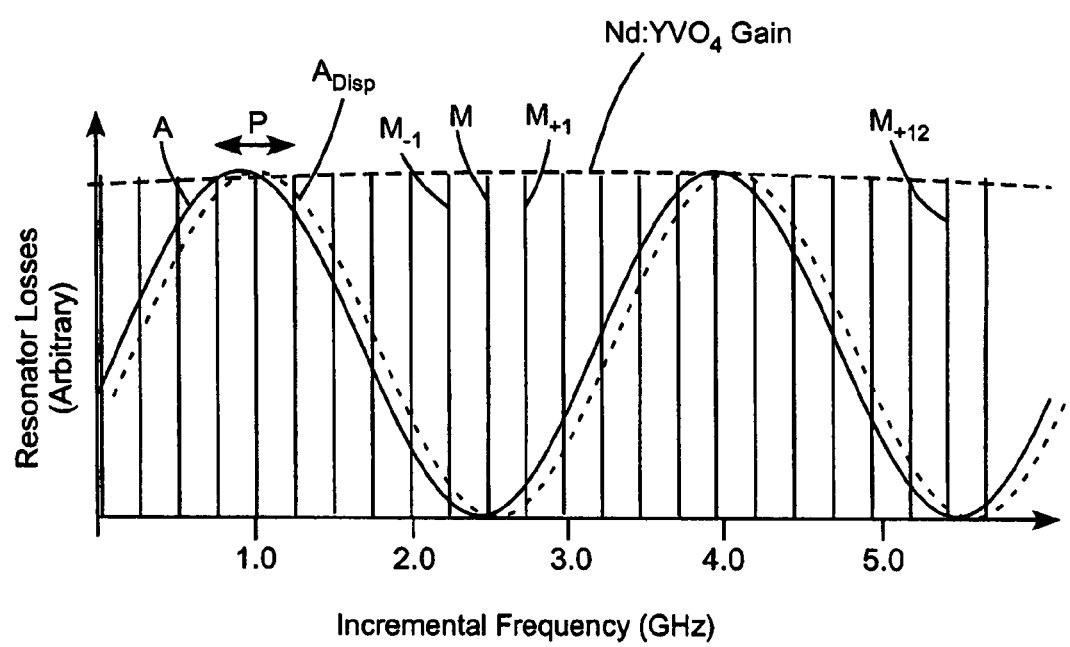
FIG. 16 is a graph schematically illustrating a periodic variation of resonator loses as a function of laser radiation frequency resulting from the path difference between fundamental and second-harmonic radiation in the laser of FIG. 15.

If the spacing $D_P$ between mirrors 86 and 88 is made sufficiently great, the phase relationship of the fundamental and 2H-radiation re-entering optically nonlinear crystal 36 is frequency dependent to an extent that there can be many possible lasing modes of resonator 82, within the gain-bandwidth of gain-element 31, for which the phase relationship is at or close to the optimum phase relationship. This can occur without any adjustment of spacing $D_P$ being necessary. FIG. 16 is a graph schematically illustrating estimated resonator losses for fundamental radiation as a function of lasing frequency (curve A) for a 10.0 mm spacing of mirrors 86 and 88. This is directly related to a frequency-dependent variation of the phase relationship between the fundamental and 2H-radiation re-entering optically nonlinear crystal 36. Losses would be highest if crystal 36 were to generate further 2H radiation rather than reconverting 2H-radiation to fundamental. Losses would be lowest, of course, when the F to 2H phase relationship is optimum and 2H-radiation is optimally re-converted to fundamental radiation. The period of frequency dependence is inversely proportional to the mirror spacing and is about 3.0 gigahertz (GHz) for a 10.0 mm spacing of mirrors 86 and 88.

The fundamental wavelength of about 1064 nm of Nd:YVO$_4$ expressed as a frequency is about 281.7 Terahertz (THz). Only an arbitrary, incremental frequency is depicted in FIG. 16 to highlight frequency spacings. The frequency spacing of possible fundamental modes in resonator 82 having a total length of about 0.6 meters is about 300.0 megahertz (MHz). Possible mode frequencies are indicated by vertical bars. The frequency spacing of the modes is determined by the fundamental frequency and the round-trip length of the resonator. The gain (long dashed curve) of Nd:YVO$_4$ has frequency-bandwidth of about (30 GHz).

It can be seen that the period of the frequency variation of the fundamental to 2H phase relationship is such that an optimum phase relationship (lowest fundamental loss) occurs at two or more frequencies in the gain bandwidth. As a laser will always lase at that frequency in the gain bandwidth for which resonator losses are lowest, and gain is highest, then laser 80 will self-select a lasing mode at which the phase relationship is optimum for converting 2H-radiation to fundamental radiation.

As exemplified in FIG. 16, the self-selected frequency would be that of mode frequency M. Mode frequencies $M_{-1}$ and $M_{+1}$, the frequencies of the next lowest and next highest frequency modes respectively, have higher loss than mode frequency M. Mode frequency $M_{+12}$ is in a (different) low lost region of the periodic loss variation curve, but in a lower gain region of the Nd:YVO$_4$ gain curve. Accordingly this mode would probably not be self-selected.

In the case where two modes such as M and $M_{-1}$ have about equal probability of being selected, laser 130 may lase by "mode hopping" from one mode to the other. This probability can be minimized by fine-adjusting the position of mirror 86 in the direction of arrows P (see FIG. 15) and correspondingly displacing curve A to a new position $A_{Disp}$ (dotted curve in FIG. 16). By way of example, a mirror position adjustment of only about 15 nm would be necessary to provide the displacement of curve A to curve $A_{Disp}$. Mirror position adjustment may also be necessary to compensate for any drift of the mode frequencies due, for example, to temperature changes in resonator 82. Mirror position may also be adjusted to align a low loss period with the peak of the gain curve. In general, it is preferred that the period of frequency variation is less than the gain bandwidth of gain element 81 but more than the fundamental mode-frequency spacing of resonator 82.

Figure 17:
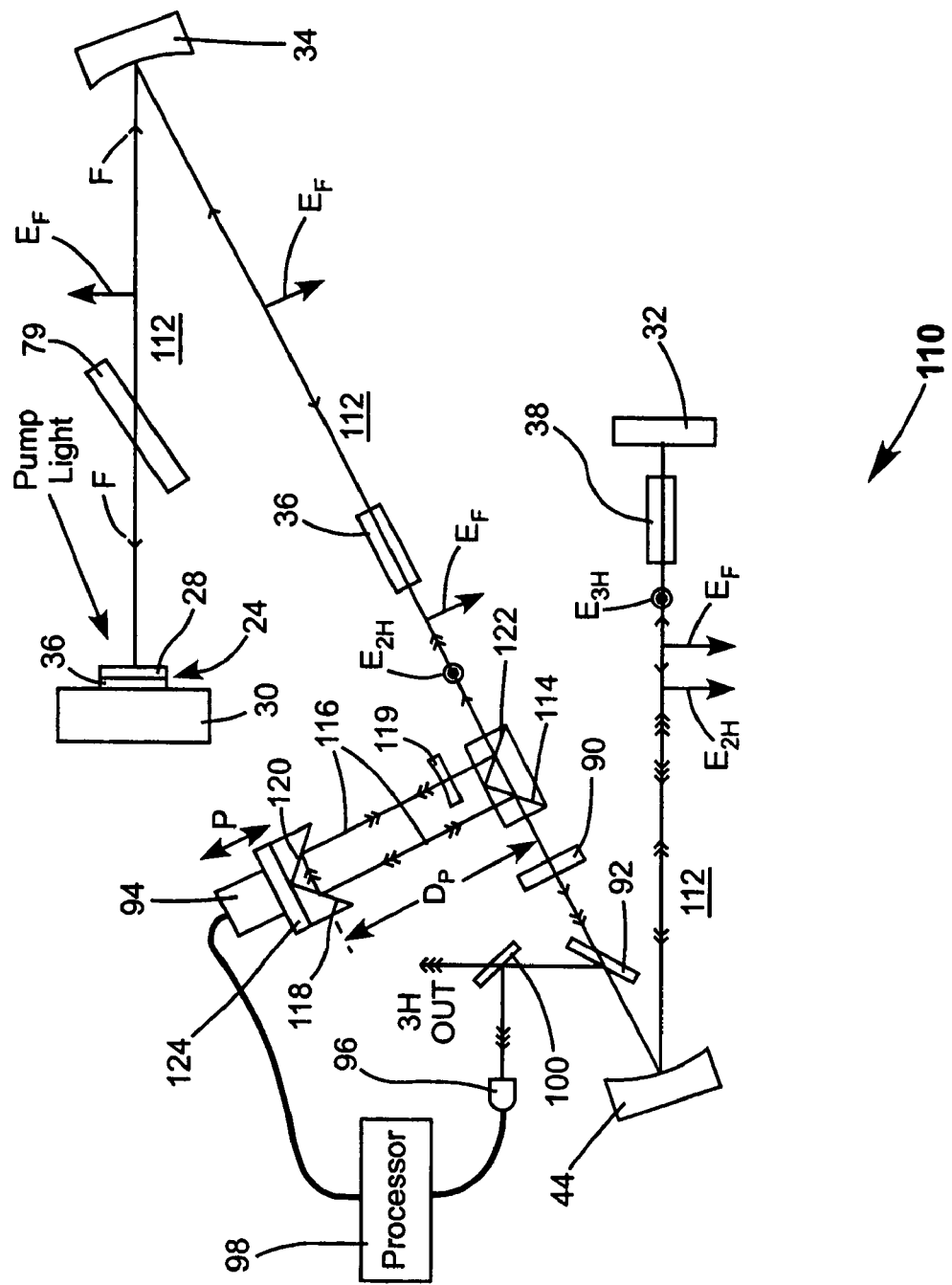
FIG. 17 schematically illustrates another further embodiment of an intracavity frequency-tripled, CW laser in accordance with the present invention, including a folded standing-wave resonator including an OPS gain-structure, two optically nonlinear crystals, and two polarizing beamsplitters and two mirrors arranged to provide a path difference between fundamental and second-harmonic radiation.

FIG. 17 schematically illustrates another embodiment 110 of a laser in accordance with the present invention including a path difference between the fundamental and 2H-radiations for providing self selection of the optimum phase relationship for re-conversion between the 2H and fundamental radiations. Laser 110 is similar to above-described laser 80 with exceptions as follows. An OPS structure 24 replaces gain-element 81 and mirror 84 of laser 80. A plane mirror 32 coated for maximum reflectivity at all the circulating fundamental wavelengths replaces mirrors 86 and 88 of laser 80. Resonator 112 of laser 110 is formed by mirror-structure 26 of OPS-structure 24, and mirrors 34, 44, and 32. In laser 110, a path difference between the fundamental and 2H-radiations is created as follows.

After exiting crystal 36, fundamental and 2H radiations are separated by polarizing beamsplitter 122, with the 2H-radiation being directed perpendicular to the direction of propagation thereof along a path 116. Fundamental radiation passes through polarizing beamsplitter 122 and through a second polarizing beam splitter 114, without a change in propagation direction. The 2H-radiation on path 116 is transmitted by a negative lens 119 is sequentially reflected from mirrors 120 and 118 back to polarizing beamsplitter 114. Mirrors 120 and 118 are spaced apart from polarizing beamsplitters 122 and 114 by a distance $D_P$. Polarizing beamsplitter 114 reflects the 2H radiation back in the propagation direction of, and along the same path as the fundamental radiation.

After exiting waveplate 90, on a return path to optically nonlinear crystal 36, fundamental and 2H radiations are separated by polarizing beamsplitter 114, with the 2H-radiation being directed perpendicular to the direction of propagation thereof back along path 116. Fundamental radiation passes through polarizing beamsplitters 114 and 122, without a change in propagation direction. The 2H-radiation on path 116 is sequentially reflected from mirrors 118 and 120 then transmitted by negative lens 119 back to polarizing beamsplitter 122. Polarizing beamsplitter 122 reflects the 2H radiation on a common path with the fundamental radiation back into optically nonlinear crystal 36.

Here, it should be noted that the path difference between the fundamental radiations in laser 110 will be four times $D_P$, rather than the two times $D_P$ in the arrangement of laser 80. Mirrors 118 and 120 are mounted on a platform 124 movable by a piezoelectric actuator 94 as indicated by arrows P. This permits making fine adjustments to the phase-relationship between the fundamental and 2H-radiations as discussed above. It is also important to include a wavelength-selective element in resonator 112 to reduce the available gain bandwidth of gain-structure 28 of OPS structure 24. This will minimize the possibility of mode-hopping and constrain the bandwidth of fundamental radiation to within the phase-match bandwidth of the optically nonlinear crystals. In resonator 112, a birefringent filter 79 is included as a wavelength-selective element. The birefringent filter, here, is inclined to the path of circulating fundamental radiation at Brewster's angle and establishes the polarization plane of the fundamental radiation.

The present invention is described above with reference to generating second-harmonic radiation from fundamental radiation for conversion to third and higher-harmonic radiation. The invention is equally applicable, however, for converting the second harmonic radiation to radiation of another, non-harmonic frequency by a parametric interaction process. The optical parametric interaction process is well known in the art and is described only briefly herein as follows.

In an optical parametric interaction process, an optically nonlinear crystal converts radiation of a particular frequency (referred to as pump-radiation) to radiation at two different frequencies which are generally referred to as a signal frequency and an idler frequency. The sum of these frequencies is equal to the pump-radiation frequency. The higher of the converted frequencies is usually designated the signal frequency. These signal and idler frequencies have a non-integer (non-harmonic) relationship with the pump frequency, and either one may be selected as an output frequency. The signal-frequency (and corresponding idler-frequency) may be continuously tuned over a range of frequencies. Tuning may be effected, for example, by adjusting the angle of the optically nonlinear crystal with respect to the direction of propagation of the pump radiation, or by varying the temperature of the optically nonlinear crystal. One preferred optically nonlinear crystal material for providing parametric mixing is BBO.

Figure 18:
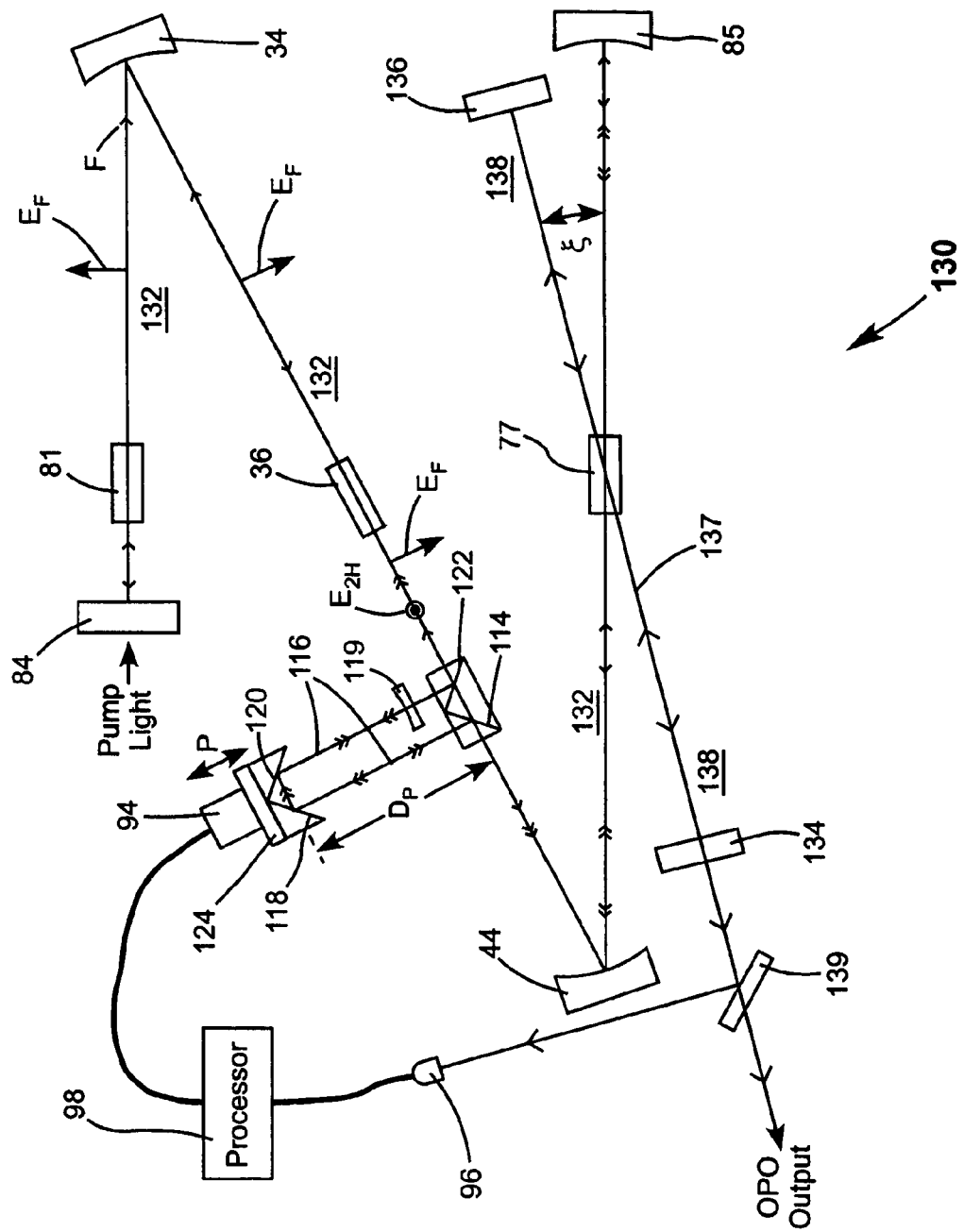
FIG. 18 schematically illustrates one preferred embodiment of an optical parametric oscillator in accordance with the present invention, wherein second-harmonic radiation is used to non-collinearly optically pump an optically nonlinear crystal arranged for optical parametric interaction with the second-harmonic radiation.

FIG. 18 schematically illustrates one preferred embodiment of an OPO 130 in accordance with the present invention. OPO 130 is similar to laser 110 of FIG. 17 with exceptions as follows. OPS structure 24 of laser 110 is replaced by a mirror 84 and a solid state gain medium 81. End mirror 32 of laser 110 is replaced by a concave mirror 85, arranged with fold mirror 44 to provide a beam waist at the optically nonlinear crystal. A resonator 132 for fundamental radiation is formed between mirrors 84 and 85. Third-harmonic generating crystal 38 of laser 110 is replaced by an optically nonlinear crystal 77 arranged for parametric interaction when pumped by 2H-radiation generated by optically nonlinear crystal 36. Optically nonlinear crystal 77 is located at a beam-waist position between the mirrors.

Mirrors 134 and 136 form a resonator 138 for the signal frequency (designated by large single arrowheads) generated by the 2H-radiation. Mirror 86 is maximally reflective, and mirror 84 is partially reflective and partially transmissive for this signal frequency. OPO output is delivered from mirror 134. It should be noted, here, that in addition to generating a signal and idler frequency for the 2H-radiation, and signal and idler frequency will also be generated for the fundamental radiation. In order to prevent oscillation of these frequencies and consequent loss of fundamental radiation, mirrors 84 and 85 should be either highly transmissive for, or strongly absorptive of the signal and idler frequencies of the fundamental radiation.

A beamsplitter mirror 139 directs a sample portion of the OPO output to a detector 96 connected with a processor 98. This can be used by the processor to drive PZT actuator 94 for making fine adjustments, if necessary, to the phase relationship between 2H and fundamental radiations entering optically nonlinear crystal 36 as discussed above.

Optical parametric oscillation here is achieved in a so-called non-collinearly pumped arrangement inasmuch as resonator axis 137 of resonator 138 is inclined at an angle $\xi$ to the direction of propagation of 2H-radiation in optically nonlinear crystal 77, i.e., inclined at an angle $\xi$ to the resonator axis of resonator 132. Angle $\xi$ is somewhat exaggerated in FIG. 18 for convenience of illustration. Similar to the previous embodiments, residual 2H-radiation from the parametric process is re-converted to fundamental radiation in a reverse pass through optically nonlinear crystal 36.

Figure 19:
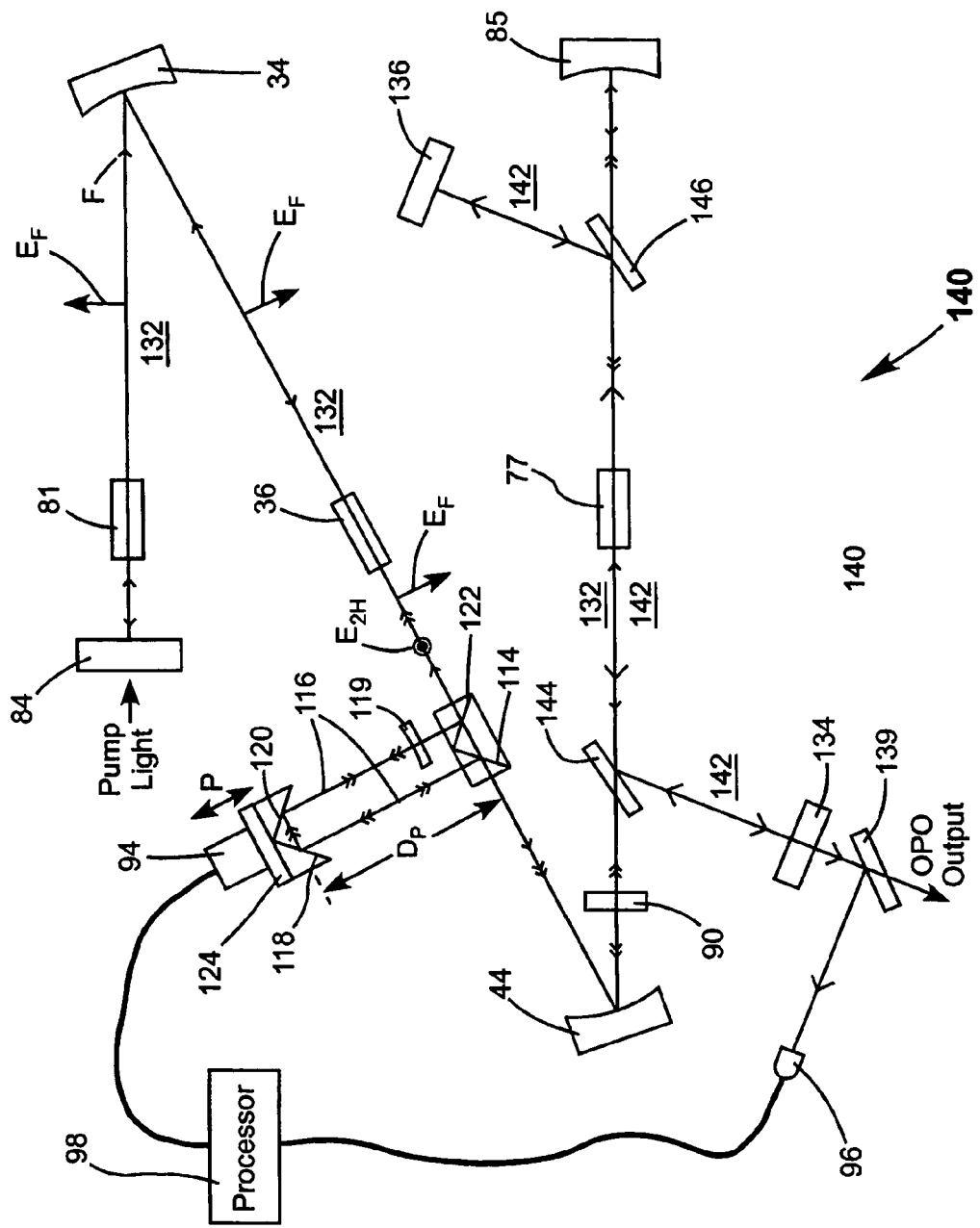
FIG. 19 schematically illustrates another preferred embodiment of an optical parametric oscillator in accordance with the present invention, wherein second-harmonic radiation is used to collinearly optically pump an optically nonlinear crystal arranged for optical parametric interaction with the second-harmonic radiation.

Optical parametric interaction is also possible in so-called collinearly pumped arrangements wherein signal-light and pump-light traverse the optically nonlinear crystal generally along a common axis. FIG. 19 schematically depicts a collinear pumped OPO 140 in accordance with the present invention. OPO 140 is similar to OPO 130 of FIG. 18 with an exception that straight OPO resonator 138 of laser 130 is replaced by a folded standing-wave OPO resonator 142. Resonator 142 is formed by an end mirror 134, fold mirrors 144 and 146, and another end mirror 136. Fold mirrors 144 and 146 are each coated to be highly reflective for the signal radiation generated by the 2H-radiation and highly transmissive for the fundamental and 2H-radiation of resonator 132. Mirror 136 is highly reflective for the converted-frequency (signal-light wavelength generated by the 2H-radiation). Mirror 184 is partially reflective and partially transmissive for the converted frequency and serves as an outcoupling mirror for the converted frequency (OPO output) from resonator 142. Fold mirrors 144 and 146 are located on the resonator axis of resonator 132 and aligned such that resonators 132 and 142 are coaxial between the fold mirrors, with optically nonlinear crystal 77 being located in this coaxial path. Waveplate 90 causes fundamental and 2H-radiation exiting optically nonlinear crystal to be polarized in the plane of incidence of the resonator mirrors. This allows mirrors 144 and 146 to be inclined at Brewster's angle to the resonator axis, thereby eliminating the need for an antireflective coating on the non-mirrored surface of the mirrors. In a reverse pass, waveplate 90 restores the relative polarizations of fundamental and 2H-radiation to the states required for reconverting 2H-radiation to fundamental radiation in optically nonlinear crystal 36.

Figure 20:
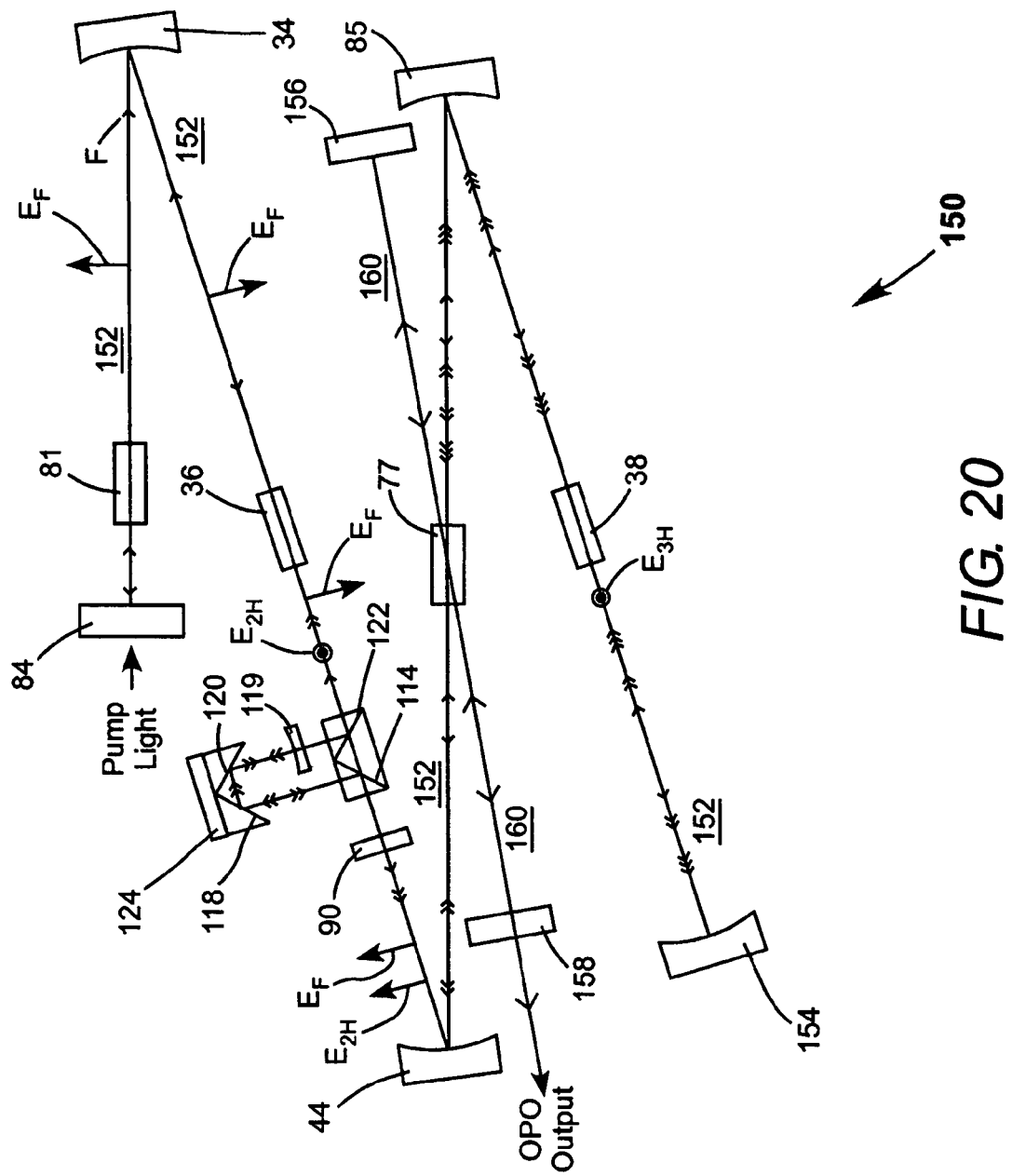
FIG. 20 schematically illustrates yet another preferred embodiment of an optical parametric oscillator in accordance with the present invention, wherein third-harmonic radiation is used to non-collinearly optically pump an optically nonlinear crystal arranged for optical parametric interaction with the third-harmonic radiation.

FIG. 20 schematically illustrates yet another embodiment 150 of an OPO in accordance with the present invention. OPO 150 is similar to OPO 130 with exceptions as follows. In OPO 150, third-harmonic radiation generated in an optically nonlinear crystal 38 is used to pump an optically nonlinear crystal 77 arranged for optical parametric interaction with the 3H-radiation.

OPO 150 includes a resonator 152. Resonator 152 is similar to resonator 132 of laser 130 with an exception that an additional "arm" of the folded resonator is provided by adding a mirror 154. Optically nonlinear 38 for generating 3H-radiation is located between mirrors 154 and 85. Optically nonlinear crystal 77 is located between mirrors 44 and 85. The 3H-radiation generated by a double pass of 2H-radiation in optically nonlinear crystal 38 provides the pump radiation for optically nonlinear crystal 77. Residual 2H-radiation from the 3H-radiation generating process is re-converted to fundamental radiation in a reverse pass through optically nonlinear crystal 36. Mirrors 156 and 158 form a oscillator for the signal frequency generated in optically nonlinear crystal 77 by the 3H-radiation. Mirror 156 is fully reflective and mirror 158 is partially reflective and partially transmissive for that signal frequency. OPO output is delivered from resonator 160 via mirror 154.

It should be noted here that an OPO in accordance with the present invention is not limited to pumping an optical parametric interaction crystal such as crystal 77 with 2H-radiation or 3H-radiation. Those skilled in the art will recognize from the above presented descriptions of inventive OPO apparatus and inventive harmonic-generating lasers, without further description or illustration, that OPO apparatus in accordance with the present invention can be configured to pump the parametric mixing crystal 77 with fourth or higher-harmonic radiation.

In summary, the present invention is described above in terms of a preferred and other embodiments. The invention is not limited, however, to the embodiments described and depicted. Rather, the invention is limited only by the claims appended hereto.

What is claimed is:

1. A laser, comprising:
    a standing-wave laser resonator;
    first and second optically nonlinear crystals located in said laser resonator, said laser resonator including at least one gain-element generating a CW fundamental radiation beam in said resonator, said fundamental radiation circulating in forward and reverse directions in said laser resonator through said optically nonlinear crystals, said gain element being an optically pumped semiconductor multi-layer gain structure;
    said first optically nonlinear crystal arranged to convert a portion of said fundamental radiation propagating therethrough in said forward direction to CW second-harmonic radiation;
    said second optically nonlinear crystal arranged to convert a portion of said second-harmonic radiation propagating therethrough in said forward and reverse directions into CW radiation having a converted frequency different from the frequency of said second-harmonic radiation; and
    wherein said first optically nonlinear crystal is arranged to convert an unconverted portion of said second-harmonic radiation propagating therethrough in said reverse direction back to fundamental radiation.

2. The laser of claim 1, wherein said converted-frequency radiation is third-harmonic radiation generated by mixing said portion of said second-harmonic radiation with a portion of said fundamental radiation.

3. The laser of claim 2, wherein said third-harmonic radiation is delivered from said resonator as output radiation.

4. The laser of claim 1, wherein said fundamental radiation has a wavelength of 976 nanometers.

5. The laser of claim 1, wherein said first optically nonlinear crystal is an LBO crystal and said second optically nonlinear crystal is a BBO crystal.

6. The laser of claim 1, wherein said first optically nonlinear crystal is an LBO crystal and said second optically nonlinear crystal is a CBO crystal.

7. The laser of claim 1, wherein said resonator is formed from a plurality of optical components and said optical components are spaced-apart and configured such that circulating fundamental radiation is focused to a reduced diameter at first and second beam waist positions, and wherein said first and second optically nonlinear crystals are located at respectively said first and second beam waist positions.

8. The laser of claim 1, wherein said converted-frequency radiation has a non-integer relationship with said second harmonic radiation and is generated by an optical parametric interaction process in said second optically nonlinear crystal.

9. The laser of claim 1, wherein said first optically nonlinear crystal is an LBO crystal and said second optically nonlinear crystal is an LBO crystal.

10. A laser, comprising:
    a standing-wave laser resonator;
    first, second and third optically nonlinear crystals located in said laser resonator, said laser resonator including at least one gain-element generating a CW fundamental radiation beam in said resonator, said fundamental radiation circulating in forward and reverse directions in said laser resonator through said optically nonlinear crystals, said gain element being an optically pumped semiconductor multi-layer gain structure;
    said first optically nonlinear crystal arranged to convert a portion of said fundamental radiation propagating therethrough in said forward direction to CW second-harmonic radiation;
    said second optically nonlinear crystal arranged to convert a portion of said second-harmonic radiation propagating therethrough in said forward and reverse directions into CW third harmonic by mixing a portion of the said second harmonic radiation with a portion of said fundamental radiation;
    said third optically nonlinear crystal arranged to mix said third-harmonic radiation with said fundamental radiation thereby providing fourth-harmonic radiation; and
    wherein said first optically nonlinear crystal is arranged to convert an unconverted portion of said second-harmonic radiation propagating therethrough in said reverse direction back to fundamental radiation.

11. The laser of claim 10, wherein said fourth-harmonic radiation is delivered from said resonator as output radiation.

12. A laser, comprising:
    a standing-wave laser resonator;
    first and second optically nonlinear crystals located in said laser resonator, said laser resonator including at least one gain-element generating a CW fundamental radiation beam in said resonator, said fundamental radiation circulating in forward and reverse directions in said laser resonator through said optically nonlinear crystals, said gain element being an optically pumped semiconductor multi-layer gain structure;
    said first optically nonlinear crystal arranged to convert a portion of said fundamental radiation propagating therethrough in said forward direction to CW second-harmonic radiation;
    said second optically nonlinear crystal arranged to convert a portion of said second-harmonic radiation propagating therethrough in said forward and reverse directions into CW third harmonic by mixing a portion of the said second harmonic radiation with a portion of said fundamental radiation; and
    wherein said first optically nonlinear crystal is arranged to convert an unconverted portion of said second-harmonic radiation propagating therethrough in said reverse direction back to fundamental radiation wherein said back conversation of second-harmonic radiation is optimized when there is a particular phase relationship between said fundamental and second-harmonic radiations on entering said first optically nonlinear crystal in said reverse direction, and wherein the laser further includes an optical arrangement for causing an optical path difference between said fundamental and second-harmonic radiations before the radiations enter said first optically nonlinear crystal in said reverse direction, thereby causing the phase relationship between said fundamental and second-harmonic radiations entering said first optically nonlinear crystal to vary periodically with frequency of said fundamental radiation, said periodic variation being such that there is at least one possible fundamental radiation frequency of said laser resonator for which said particular phase relationship exists at said first nonlinear crystal.

13. The laser of claim 12, wherein said resonator has a mode-spacing, said gain-element has a gain bandwidth, and said periodically varying phase relationship has a period less than said gain bandwidth and greater than said mode spacing.

14. The laser of claim 13, wherein said fundamental radiation has a wavelength of about 1064 nanometers, said mode spacing is about 300 MHz, said gain bandwidth is about 30 GHz and said phase relationship variation period is about 3 GHz.

15. The laser of claim 12, wherein said path difference between said fundamental and second-harmonic radiations is adjustable.

16. A laser, comprising:
a standing-wave laser resonator;
first and second optically nonlinear crystals located in said laser resonator, said laser resonator including at least one gain-element generating a CW fundamental radiation beam in said resonator, said fundamental radiation circulating in forward and reverse directions in said laser resonator through said optically nonlinear crystals, said gain element being an optically pumped semiconductor multi-layer gain structure;
said first optically nonlinear crystal arranged to convert a portion of said fundamental radiation propagating therethrough in said forward direction to CW second-harmonic radiation;
said second optically nonlinear crystal arranged to convert a portion of said second-harmonic radiation propagating therethrough in said forward and reverse directions into CW radiation having a converted frequency different from the frequency of said second-harmonic radiation and wherein said converted-frequency radiation has a non-integer relationship with said second harmonic radiation and is generated by an optical parametric interaction process in said second optically nonlinear crystal and wherein said second optically nonlinear crystal is collocated in a second resonator arranged such that said converted-frequency radiation circulates in said second resonator; and
wherein said first optically nonlinear crystal is arranged to convert an unconverted portion of said second-harmonic radiation propagating therethrough in said reverse direction back to fundamental radiation.

17. The laser of claim 16, wherein said second resonator is a standing-wave resonator.

18. The laser of claim 17, wherein said standing-wave resonator and said second resonator are partially coaxial and said second optically nonlinear crystal is located in said coaxial part of said resonators.

19. The laser of claim 16, wherein said converted-frequency radiation is delivered from said second resonator as output radiation.

* * * * *